United States Patent
Hill et al.

(10) Patent No.: US 11,527,489 B2
(45) Date of Patent: Dec. 13, 2022

(54) APPARATUS AND SYSTEM WITH PACKAGE STIFFENING MAGNETIC INDUCTOR CORE AND METHODS OF MAKING THE SAME

(71) Applicant: Intel Corporation, Santa Clara, CA (US)

(72) Inventors: Michael J. Hill, Gilbert, AZ (US); Mathew Manusharow, Phoenix, AZ (US); Beomseok Choi, Chandler, AZ (US); Digvijay Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 913 days.

(21) Appl. No.: 16/024,007

(22) Filed: Jun. 29, 2018

(65) Prior Publication Data

US 2020/0006250 A1   Jan. 2, 2020

(51) Int. Cl.

| H01L 23/16 | (2006.01) |
|---|---|
| H01L 23/00 | (2006.01) |
| H01L 23/64 | (2006.01) |
| G06F 1/28 | (2006.01) |
| H01F 27/28 | (2006.01) |
| H01F 38/14 | (2006.01) |
| H01L 25/18 | (2006.01) |

(52) U.S. Cl.
CPC .............. *H01L 23/562* (2013.01); *G06F 1/28* (2013.01); *H01F 27/28* (2013.01); *H01F 38/14* (2013.01); *H01L 23/16* (2013.01); *H01L 23/645* (2013.01); *H01L 25/18* (2013.01); *H01L 23/00* (2013.01)

(58) Field of Classification Search
CPC ... H05K 1/11; H05K 1/18; H05K 3/30; G01R 33/00; G01R 33/03; G01R 33/038; H01F 17/00; H01F 17/06; H01F 17/08; H01F 17/0033; H01F 27/28; H01F 27/2804; H01F 27/38; H01L 23/16; H01L 23/645; H01L 23/562
USPC .......... 361/765–784, 803, 748; 336/199–232
See application file for complete search history.

(56) References Cited

U.S. PATENT DOCUMENTS

| 4,847,986 A * | 7/1989 | Meinel ................ H01F 17/0033 29/606 |
|---|---|---|
| 6,542,379 B1 * | 4/2003 | Lauffer ............... H01F 17/0033 174/260 |
| 10,788,546 B2 * | 9/2020 | Bilbao De Mendizabal ............... G01R 33/0035 |
| 2005/0122198 A1 | 6/2005 | Zhou et al. |
| 2009/0134503 A1 * | 5/2009 | Feng .................. H01F 17/0033 257/673 |

(Continued)

*Primary Examiner* — Tuan T Dinh
(74) *Attorney, Agent, or Firm* — Essential Patents Group, LLP.

(57) ABSTRACT

An apparatus includes a substrate, one or more integrated circuit dies on the substrate, and a stiffener affixed to the substrate. One or more sections of the stiffener may includes a magnetic material. The apparatus further includes an inductive circuit element comprising one or more conductive structures wrapped around the magnetic material. In some examples where a first coil is wrapped around a first section of the stiffener, and a second coil is wrapped around a second section of the stiffener, current supplied to the first coil generates at the second coil a current that is further transmitted to the one or more semiconductor dies.

17 Claims, 8 Drawing Sheets

(56) References Cited

U.S. PATENT DOCUMENTS

| | | | |
|---|---|---|---|
| 2010/0007456 A1* | 1/2010 | Joehren | H01F 17/0033 336/200 |
| 2011/0279214 A1* | 11/2011 | Lee | H01F 17/08 336/220 |
| 2013/0070282 A1* | 3/2013 | Takahashi | G06F 3/1285 358/1.14 |
| 2014/0027879 A1* | 1/2014 | Weyers | H01L 28/10 438/381 |
| 2014/0160675 A1* | 6/2014 | Roy | H01L 23/642 361/679.56 |
| 2014/0198463 A1* | 7/2014 | Klein | G01R 1/04 174/257 |
| 2015/0042325 A1* | 2/2015 | Snoeij | G01R 15/20 324/251 |
| 2015/0048820 A1* | 2/2015 | Schaffer | G01R 33/0023 324/253 |
| 2018/0122748 A1* | 5/2018 | Hsu | H01L 23/562 |
| 2019/0107585 A1* | 4/2019 | Huber Lindenberger | G01R 33/0035 |

* cited by examiner

APPARATUS AND SYSTEM WITH PACKAGE STIFFENING MAGNETIC INDUCTOR CORE AND METHODS OF MAKING THE SAME

BACKGROUND

Warpage in thin microelectronic package structures has been a challenge in the fabrication of packaged devices. Temperature coefficients of thermal expansion (CTE) may differ between a device and a package substrate, which may contribute to the problem. Temperature processing, such as a solder reflow process, may contribute to a significant amount of warpage, which in turn can cause opens in circuitry, resulting in loss of yield and reduced reliability of a packaged device. Stiffeners, such as metal stiffeners, can be employed which may reduce warpage in thin packages.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
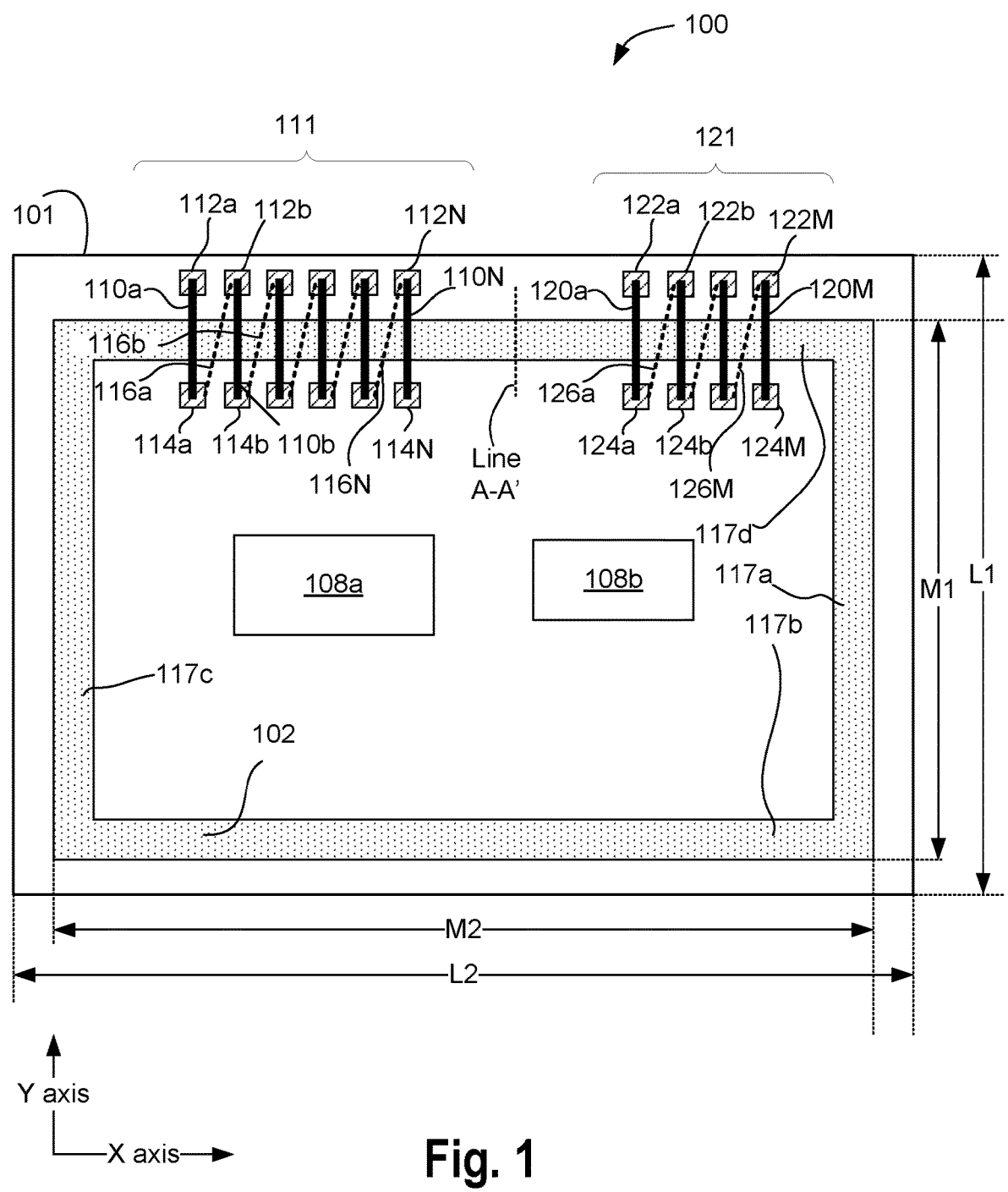
FIG. 1 illustrates a top view of a semiconductor device package that includes a package substrate, where a stiffener is further operable as a magnetic core, according to some embodiments.

In some examples, a stiffener may be employed on a package substrate, e.g., to mitigate or reduce warpage in thin packages. The stiffener may provide mechanical rigidity and structural support to the substrate.

In some embodiments, the stiffener is operable for other purposes as well. For example, the stiffener is operable as a magnetic core for a transformer, an inductor, an electrical choke, or the like. The stiffener may include magnetic material. Also, one or more coils may be wrapped around the stiffener. When current is passed through a first coil wrapped around the stiffener, current is generated in a second coil wrapped around the stiffener, where the stiffener acts as a magnetic core to couple the two coils based on the principle of Faraday's law of induction. Similarly, the stiffener and a coil wrapped around it may also be employed as an inductor, an electrical choke, etc.

Integrated voltage regulators (e.g., VRs that are integrated within an integrated circuit package) may rely on discrete or package embedded inductors. For higher voltage applications and for certain VR topologies, magnetic transformers may be advantageous (e.g., as compared to an air-core architecture). In some examples, a high voltage to low voltage step down conversion implemented integrally within a package may be a useful feature. Magnetic transformers placed on package substrates may enable efficient topologies for high voltage step down voltage regulators. Additionally, many thin package technologies use stiffener (e.g., metallic stiffener) components to maintain substrate flatness and to reduce warpage. Through the use of magnetic transformer core elements as the stiffening ring, coupled with package traces and wirebond or discrete jumper surface mount (SMT) components, a package integrated magnetic transformer may be created. Employing the stiffener as a magnetic core may save area and/or cost (e.g., as no separate magnetic core and/or stiffener may be needed). Other technical effects will be evident from the various embodiments described further below.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top", "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 illustrates a top view of a semiconductor device package 100 (also referred to as package 100) that includes a package substrate 101, where a stiffener 102 is further operable as a magnetic core, according to some embodiments. The package 100 may comprise one or more devices, e.g., devices 108a, 108b, etc. Although two devices 108a, 108b are illustrated in FIG. 1, the package 100 may comprise any appropriate number of devices. In some embodiments, the devices 108a, 108b may be stacked (e.g., the devices 108a may be on the devices 108b) on the substrate 101, although such stacked devices are not illustrated in FIG. 1.

Elements referred to herein with a common reference label followed by a particular number or alphabet character may be collectively referred to by the reference label alone. For example, devices 108a, 108b may be collectively and generally referred to as devices 108 in plural, and device 108 in singular.

In some examples, the devices 108 are microelectronic dies. A device 108 may comprise any type of microelectronic device, such as but not limited to a microprocessor, a graphics processor, a signal processor, a network processor, a chipset, etc. In some examples, a device 108 is a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices. The device/die 108 may be electrically and physically coupled with the substrate 101 by, for example, solder balls, conductive structures, wire bonds, etc. (not illustrated in FIG. 1).

In some examples, the substrate 101 is a board such as a fiberglass reinforced epoxy laminated board that is flame retardant (FR4), for example. In some examples, the package substrate 101 includes a portion of a board, such as a printed circuit board (PCB board). In some examples, the substrate 101 is a motherboard.

In some examples, a thickness of the substrate 101 is less than, for example, 1 millimeter (mm), 0.8 mm, 0.5 mm, or the like. However, such ranges of thickness are merely examples and does not limit the scope of this disclosure. In some embodiments, the package 100 (e.g., with a relatively thin substrate 101) may experience warpage. For example, temperature coefficients of thermal expansion (CTE) may differ between the devices 108 and the substrate 101. During fabrication (or during use) of the package 100, relatively high temperatures (e.g., which may be generated during temperature processing, such as a solder reflow process or any other appropriate process) may contribute warpage, which in turn can cause opens in circuitry, resulting in loss of yield, and/or reduced reliability of a packaged device.

In some embodiments, the package 100 includes a stiffener structure 102 (also referred to as stiffener 102). The stiffener 102 may be on a top surface of the substrate 101. In some examples, at least a section of the stiffener 102 may be, at least in part, embedded within the substrate 101.

In some examples, adhesives (e.g., non-conductive adhesives, not illustrated) may be between the stiffener 102 and the substrate 101, e.g., to affix the stiffener 102 to the substrate 101. In some embodiments, such non-conductive adhesive may comprise materials such as epoxy.

The stiffer 102 may impart mechanical rigidity to the substrate 101, e.g., to mitigate or reduce warpage of the package 100. In some embodiments, the stiffener 102 is disposed along a periphery or perimeter of the substrate 101. The stiffener 102 forms an unbroken loop, e.g., a closed loop, along the periphery or perimeter of the substrate 101. Locating the stiffener 102 along the periphery of the substrate 101 may provide appropriate mechanical rigidity to the substrate 101.

The stiffener 102 structure of FIG. 1 has four intersecting segments 117a, 117b, 117c, 117d respectively along four sides of the perimeter of the substrate 101. For example, a first side of the substrate 101 has a length of L1, and a first segment 117a of the stiffener 102 along the first side of the substrate 101 has a length of M1, as illustrated in FIG. 1. In an example, M1 is 50% or more, 75% or more, 80% or more, or 90% or more of L1. In another example, a second side of the substrate 101 (e.g., which is perpendicular to the first side) has a length of L2, and a second segment 117b of the stiffener 102 along the second side of the substrate 101 has a length of M2, as illustrated in FIG. 1. The second segment 117b of the stiffener 101 intersects and is substantially perpendicular to the first segment 117a of the stiffener 101. In an example, M2 is 50% or more, 75% or more, 80% or more, or 90% or more of L2. Similar dimensions of a third segment 117c and a fourth segment 117d of the stiffener 101, respectively along a third and fourth side of the substrate 101, may also be defined, although not illustrated in FIG. 1. The third segment 117c is substantially perpendicular to and intersects with the second segment 117b, and is parallel to the first segment 117a. The fourth segment 117d is substantially perpendicular to and intersects with the first and third and segments 117a, 117c, and is parallel to the second segment 117b.

In an example, M1 being a higher percentage of L1 (e.g., 80% or more, 90% or more, etc.) results in the second segment 117b being relatively near the second side and the third segment 117c being relatively near the third side. The ratio of M1 and L1 (or M2 and L2, etc.) may be based on how close the stiffener 102 is to be to the perimeter of the substrate In an example, the stiffener 102 forms an unbroken loop, e.g., a closed loop, along the perimeter of the substrate 101. The intersecting segments 117a, 117b, 117c, 117d form a continuous loop around the devices 108 and along the perimeter of the substrate 101. In an example, if the area of a top surface of the substrate 101 is S1 and the area within the four segments 117 of the stiffener 102 is S2, then S2 is about 90% or more, about 80% or more, about 75% or more, about 50% or more, or about 30% or more of S1.

In some embodiments, the stiffener 102 is further operable as a magnetic core for a one or more circuit elements of the package 100. For example, the stiffener 102 may be a magnetic core for a transformer, an inductor, an electrical choke, etc. Thus, the stiffener 102 may have appropriate mechanical properties to provide sufficient rigidity to the substrate 101, and may also have magnetic properties appropriate for a magnetic core. As an example, the stiffener 102 may include material that is rigid and has magnetic properties. In an example, substantially an entirety of the stiffener 102 exhibits magnetic properties.

Suitable materials for the stiffener 102 may include, but are not limited to, Cobalt (Co), Manganese (Mn), Silicon Steel, Nickel, Molybdenum, ferritic Stainless Steel, Aluminum, Copper, Iron, molded plastic with magnetic particles, magnetic ceramic material, and/or the like.

In some embodiments, coil structures 111 and 121 may be wrapped around one or more sections of the stiffener 102. Where the stiffener 102 is entirely magnetic material, coil structures 111 and 121 may be positioned anywhere along the lengths of the stiffener segments. As an example, coil structure 111 (also referred to as coil 111) may comprise conductive structures 110a, 110b, . . . , 110N that are on top of the stiffener 102, and conductive structures 116a, 116b, . . . , 116N that are below or underneath the stiffener 102. Individual ones of the conductive structures 112a, 112b, 112N and conductive structures 114a, 114b, . . . , 114N may couple a conductive structure 110 to a corresponding conductive structure 116. As the conductive structures 116 may not be visible in the top view of FIG. 1, the conductive structures 116 are illustrated using dotted lines.

For example, the conductive structure 114a couples an end of the conductive structure 110a to an end of the conductive structure 116a; the conductive structure 112b couples another end of the conductive structure 116a to an end of the conductive structure 110b; the conductive structure 114b couples another end of the conductive structure 110b to an end of the conductive structure 116b, and so on.

Figure 2:
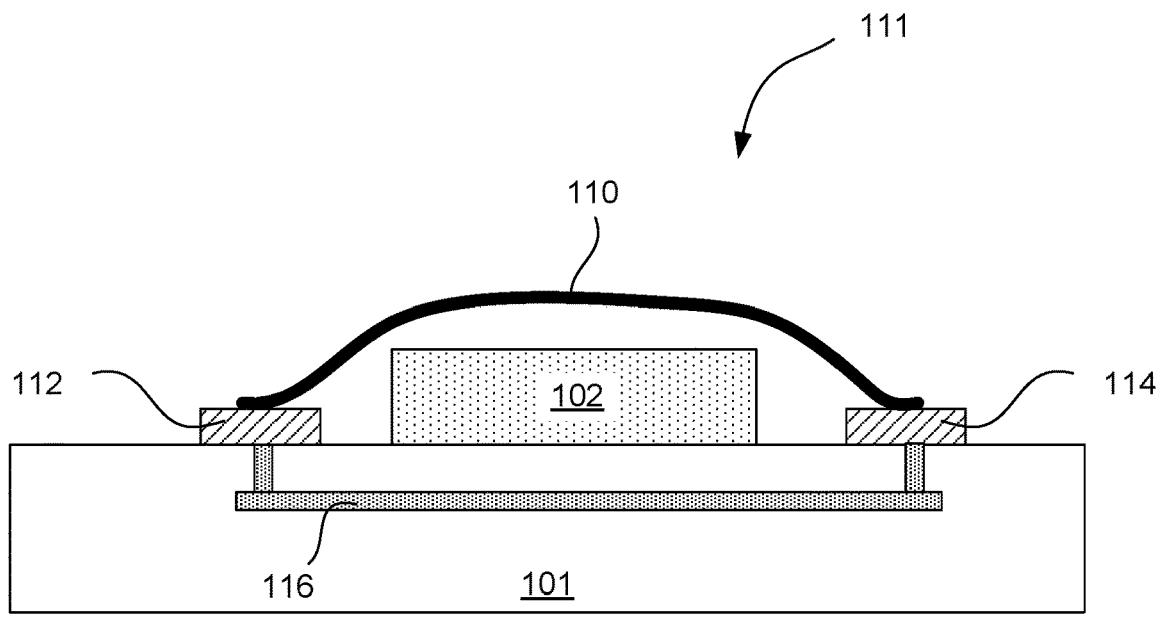
FIG. 2 illustrates a cross sectional view of a coil wrapping around a stiffener of a package, according to some embodiments.

FIG. 2 illustrates a cross sectional view of the coil 111 wrapping around the stiffener 102 of the package 100 of FIG. 1, according to some embodiments. For example, the view of FIG. 2 is when the coil 111 is viewed from the dotted line A-A' of FIG. 1.

Illustrated in FIG. 2 is the substrate 101 and the stiffener 102 disposed thereon. FIG. 2 also illustrates example conductive structures 110, 112, 114, 116. Although the cross-sectional view of FIG. 2 illustrates the conductive structures 110, 112, 114, 116 forming a loop around the stiffener 102, such a loop is merely visible in the cross-sectional view—in reality, the coil 111 is wrapped around in a helix or spring like shape (e.g., as illustrated in FIG. 1), e.g., to an extent similar to the windings of coils of a transformer around a core.

As illustrated in FIGS. 1 and 2, the conductive structures 116 may be underneath or below the stiffener 102. For example, the conductive structures 116 may be in-package routing, such as routing or traces that are at least in part embedded within the substrate 101, or that are at least in part on the substrate 101. As illustrated in FIGS. 1 and 2, the conductive structures 112, 114 may be on sides of the stiffener 102. The conductive structures 112, 114 may be conductive pillars (e.g., copper pillars), solder balls, pads, bumps, etc. As illustrated in FIGS. 1 and 2, the conductive structures 110 may be surface mountable components, wire bonds, wires, etc. In some embodiments, the conductive structures 110 are encapsulated with a molding compound or encapsulant (not illustrated in the figures).

Where the stiffener 102 is entirely magnetic material, coil structures 111 and 121 may occupy any portion of the stiffener segments. Referring again to FIG. 1, a length of the coil 111 is about A1% of a length L2 of the segment 117d of the stiffener 102, where "A1" can be about 10%, 20%, less than 50%, less than 60%, and/or the like. A length of the coil 121 is about A2% of a length L2 of the segment 117d of the stiffener 102, where "A2" can be about 10%, 20%, less than 50%, less than 60%, and/or the like.

Figure 3:
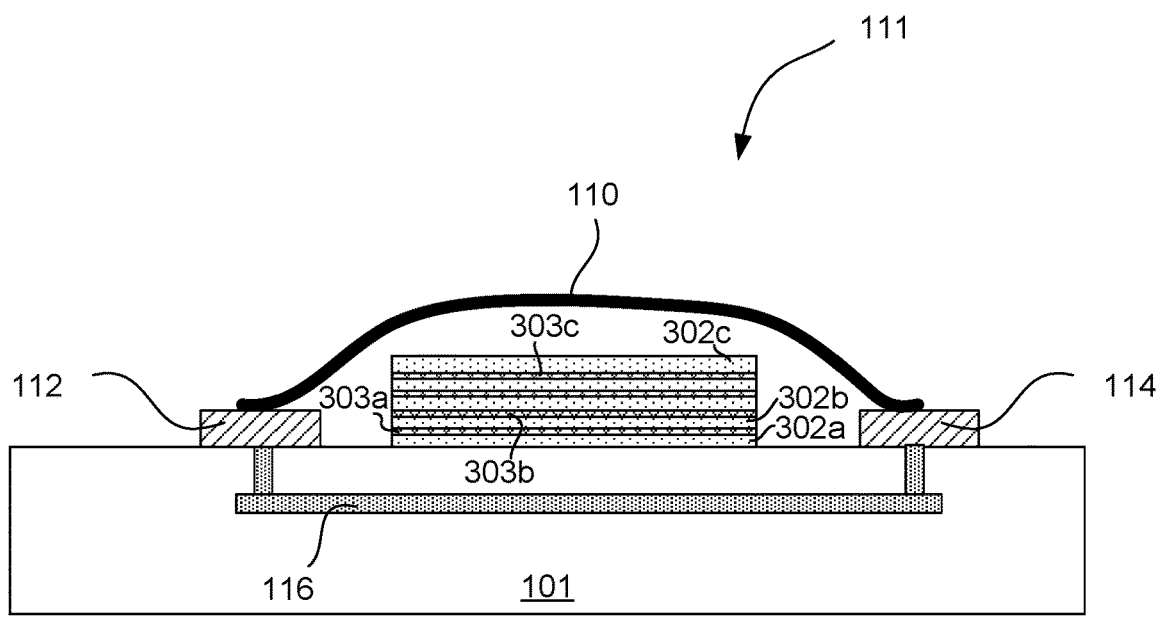
FIG. 3 illustrates a cross sectional view of a coil wrapping around a stiffener of a package, where the stiffener includes a plurality of layers of magnetic material interleaved with a corresponding plurality of insulating layers, according to some embodiments.

FIG. 3 illustrates a cross sectional view of the coil 111 wrapping around the stiffener 102 of the package 100 of FIG. 1, where the stiffener 102 includes a plurality of layers of magnetic material interleaved with a corresponding plurality of insulating layers, according to some embodiments. The illustration of FIG. 3 is at least in part similar to the illustration of FIG. 2. However, unlike FIG. 2, the FIG. 3 the stiffener 102 includes the plurality of layers 302a, . . . , 302c of magnetic material interleaved with the corresponding plurality of insulating layers 303a, . . . , 303c. For example, the layers 302, 303 may be laminated using an appropriate adhesive. In some embodiments, the stiffener 102 is laminated to reduce or eliminate eddy currents when the stiffener 102 operates as a magnetic core for a transformer, an inductor, a choke, etc. For example, the insulating layers 303 may prevent flow of eddy currents through the layers 302, thereby preventing or reducing power loss.

Figure 4:
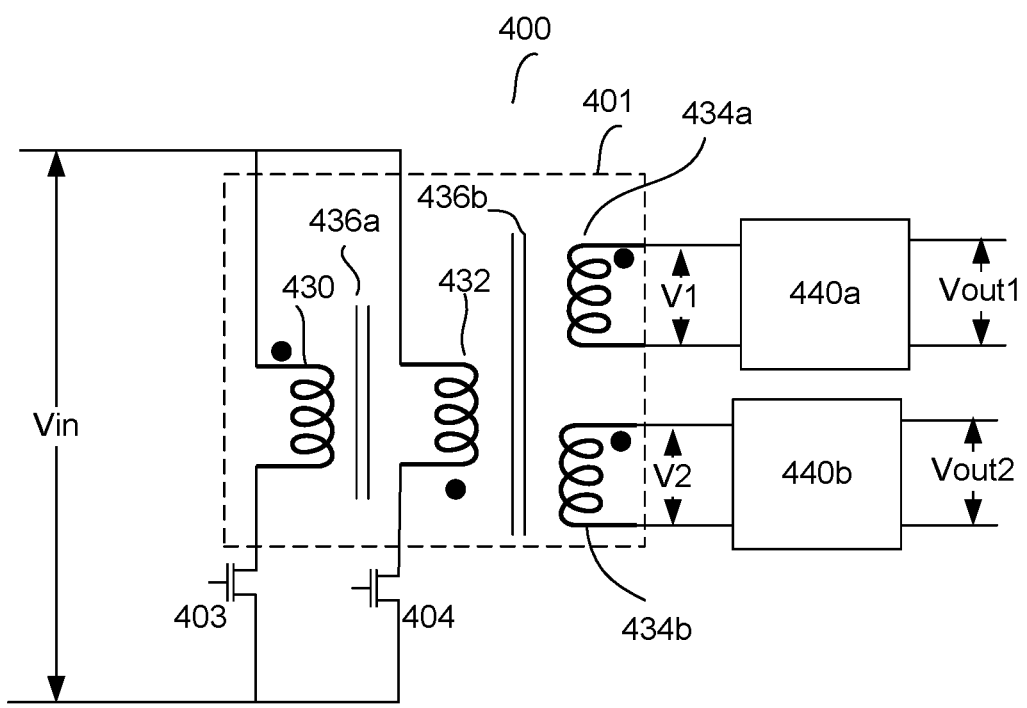
FIG. 4 illustrates a system comprising a transformer that uses a stiffener to magnetically couple various coils of the transformer, according to some embodiments.

FIG. 4 illustrates a system 400 comprising a transformer 401 that uses the stiffener 102 to magnetically couple various coils of the transformer 400, according to some embodiments. For example, the transformer 400 is implemented as a forward converter. A forward converter is a DC/DC converter that uses transformer action to increase or decrease the output voltage (e.g., depending on the transformer ratio) and provide galvanic isolation for the load.

In some embodiments, the system 400 may be implemented within the package 100. The transformer 400 comprises two primary coils 430 and 432, controlled by switches (e.g., transistors) 403 and 404, respectively. An input to the transformer is a voltage Vin. The transformer 400 includes, as an example, two secondary windings 434a and 434b. Depending on the winding ratio, the secondary windings 434a and 434b may generate any appropriate voltage, such as voltages V1 and V2. In some embodiments, the voltages V1 and V2 may be received by corresponding voltage regulators (VRs) 440a, 440b, respectively. The VRs 440a, 440b may generate output voltages Vout1, Vout2.

In some embodiments, any two of the windings 430, 434, 434a, 434b may correspond to the coils 111, 121 of FIGS. 1-3. For example, the coils 111, 121 may represent any two of the windings 430, 434, 434a, 434b. The package 100 may have two other coils (e.g., similar to the coils 111, 121). For example, the windings 430, 434, 434a, 434b may wrap around the stiffener 102 of the package 100. In some embodiments, the magnetic couplings 436a, 436b in the transformer 400 between various windings may be through the stiffener 102.

In some embodiments, due to the use of the transformer 400 in the package 100, the package 100 may receive relatively high voltage (e.g., as high as 48 V, or any other appropriate high voltage), and the transformer 400 may be used to generate lower voltages V1, V2 for the various VRs 440a, 440b. The transformer secondary side may have multi-tap, e.g., to generate different output voltages V1, V2 for different VRs 440a, 440b, respectively.

In an example, because the stiffener 102 forms an unbroken loop, e.g., a closed loop, along the periphery of the substrate 101, the magnetic path of a transformer is complete along the closed loop of the stiffener 102. Although FIG. 4 illustrates the stiffener 102 as a magnetic core in a transformer of the package 100, the stiffener 102 may also be a magnetic core in one or more inductors, one or more electric choke, and/or in any appropriate component that includes a magnetic core or a magnetic element.

Figure 5:
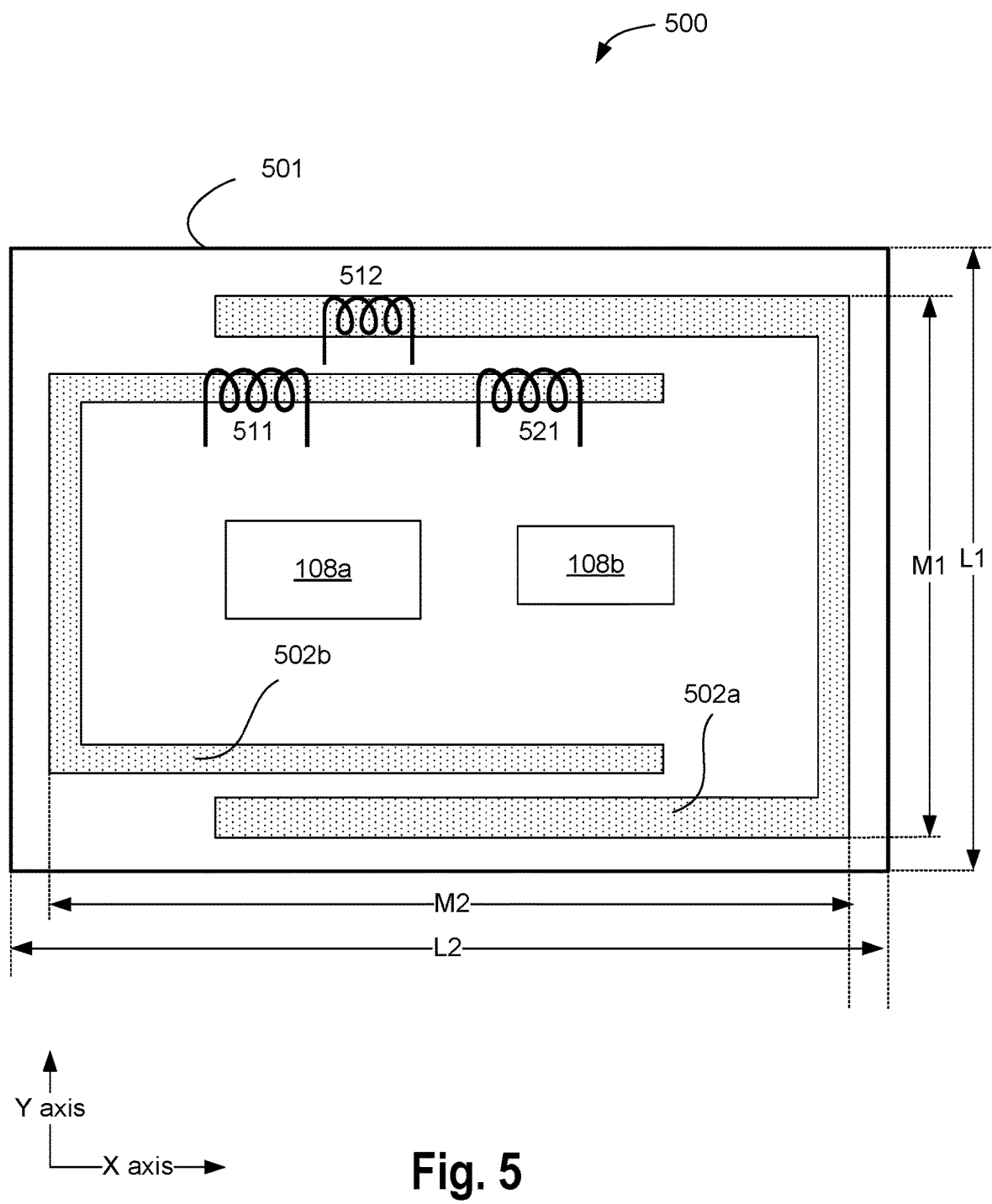
FIG. 5 illustrates a top view of a semiconductor package that includes a package substrate, where a stiffener of the package is divided in multiple magnetically decoupled sections and are reused as corresponding multiple magnetic cores, according to some embodiments.

In FIG. 1, the stiffener 102 forms an unbroken loop, e.g., a closed loop, of magnetic material along the periphery of the substrate 101. In some other embodiments, the stiffener 102 is divided in sections, so that multiple magnetically decoupled stiffener sections are formed, where each section may be used to form a magnetic core for a corresponding component. For example, FIG. 5 illustrates a top view of a semiconductor package 500 (also referred to as package 500) that includes a package substrate 501, where a stiffener 502 of the package 500 is divided in multiple magnetically decoupled sections 502a, 502b (e.g., the sections 502a, 502b are magnetically isolated from each other) and are operable as corresponding multiple magnetic cores, according to some embodiments. For example, as the magnetic material of the section 502a is physically separated from the magnetic material of the section 502b, the sections 502a, 502b form two different isolated magnetic sections (e.g., are magnetically isolated or decoupled from each other). Similar to FIG. 1, the package 500 comprises the devices 108a, 108b.

In some embodiments, a coil 512 (which may be similar to one of the coils 111, 121 of FIG. 1, but are symbolically illustrated using a spring like structure in FIG. 5) is wrapped around a section of the stiffener 502a. In an example, the coil 512, along with the stiffener 502a, may act as an inductor.

In some embodiments, coils 511 and 521 (which may be similar to the coils 111, 121 of FIG. 1, but are symbolically illustrated using spring like structures in FIG. 5) are wrapped around corresponding sections of the stiffener 502b. In an example and as discussed with respect to FIG. 1, the coils 511, 512, along with the stiffener 502a, may act as a transformer.

Figure 6:
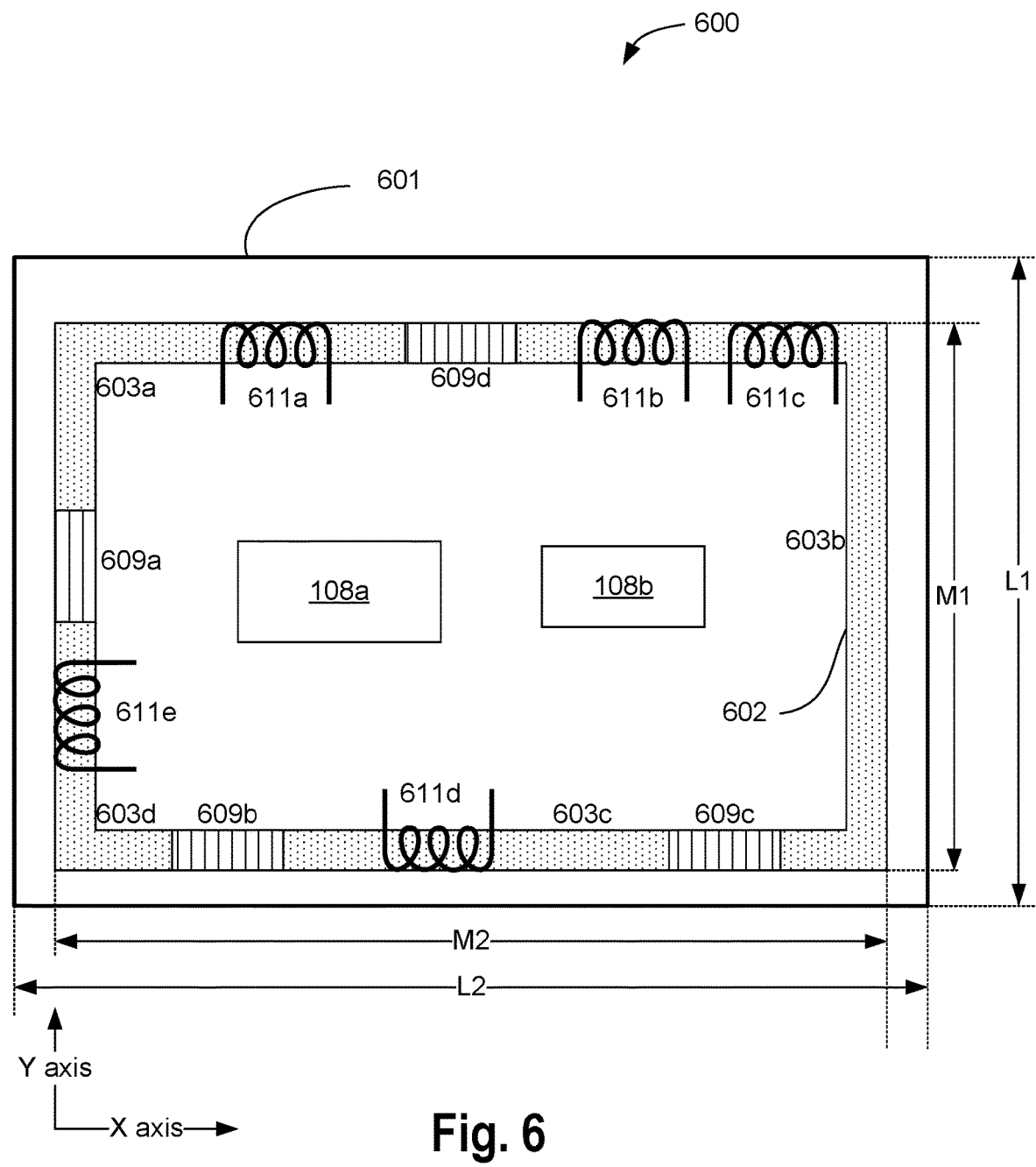
FIG. 6 illustrates a top view of a semiconductor package that includes a package substrate, where a stiffener of the package is divided in multiple magnetic sections that are separated by corresponding non-magnetic sections, according to some embodiments.

FIG. 6 illustrates a top view of a semiconductor package 600 (also referred to as package 600) that includes a package substrate 601, where a stiffener 602 of the package 600 is divided in multiple discrete magnetic sections 603a, . . . , 603d that are separated using non-magnetic sections 609a, . . . , 609d, and the sections 603a, . . . , 603d of the stiffener 602 are further operable as corresponding multiple magnetic cores, according to some embodiments. For example, the sections 609a, . . . , 609d include non-magnetic rigid material, such that the stiffener 602 (e.g., which includes the magnetic sections 603 and non-magnetic sections 609) provide sufficient mechanical rigidity to avoid warpage in the package 600. The magnetic sections 603 and non-magnetic sections 609 are interleaved. Also, as the sections 603a, 603b, 603c, and 603d are separate and discrete sections (e.g., separated by corresponding non-magnetic sections 609), these sections may be used as four different magnetic cores. For example, coil 611a in the magnetic section 603a may be used as an inductor, coils 611b, 611c in the magnetic section 603b may be used as a transformer, and so on.

Figure 7A:
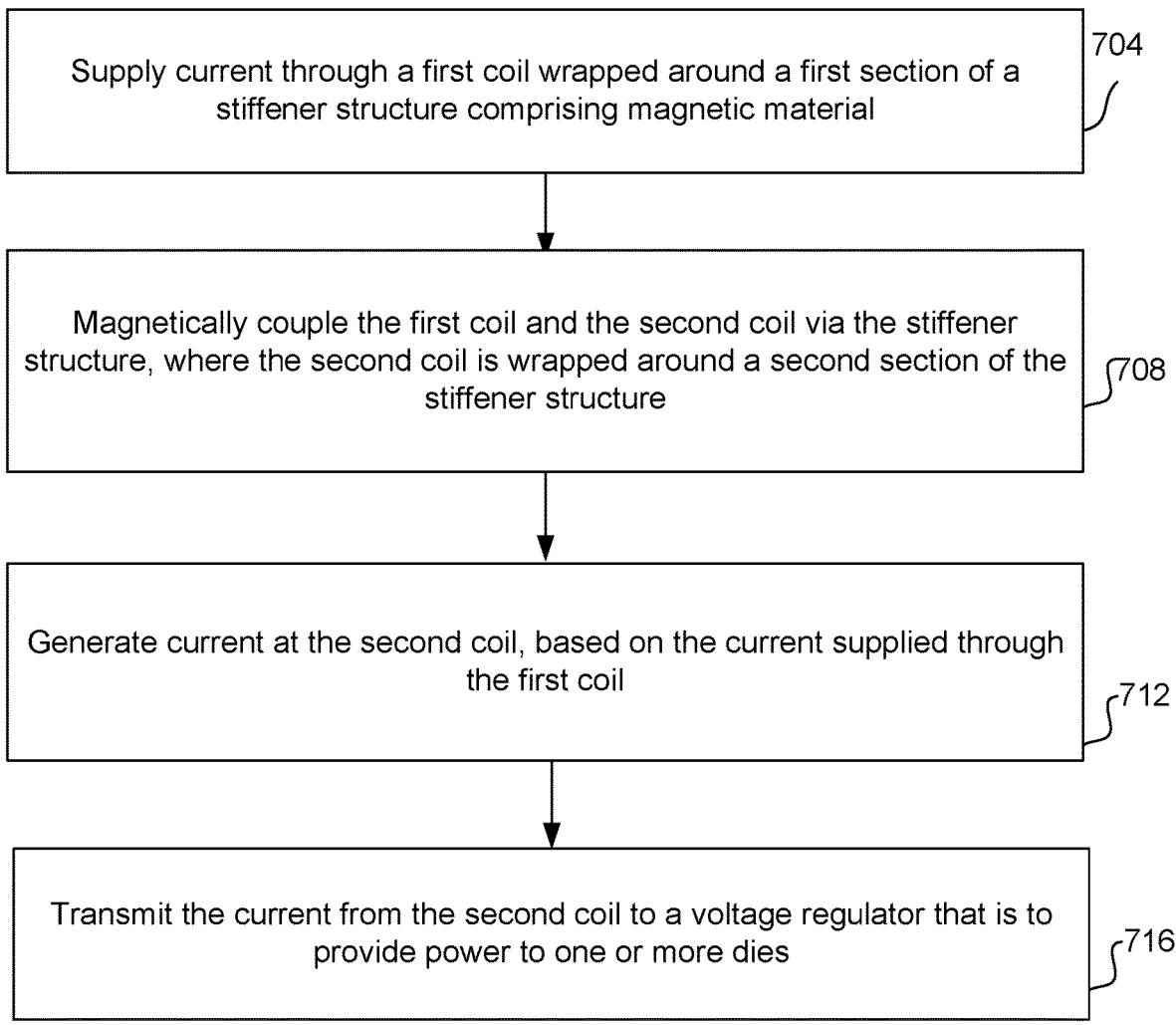
FIG. 7A illustrates a flowchart depicting a method for operating a stiffener structure as a magnetic core of a transformer, according to some embodiments.

FIG. 7A illustrates a flowchart depicting a method 700 for operating a stiffener structure as a magnetic core of a transformer, according to some embodiments. Although the blocks in the flowchart with reference to FIG. 7A are shown in a particular order, the order of the actions can be modified. Thus, the illustrated embodiments can be performed in a different order, and some actions/blocks may be performed in parallel. Some of the blocks and/or operations listed in FIG. 7A may be optional in accordance with certain embodiments. The numbering of the blocks presented is for the sake of clarity and is not intended to prescribe an order of operations in which the various blocks must occur.

At 704 of the method 700, current may be supplied through a first coil (e.g., one of coils 111, 430, 511, or 611*b*) that is wrapped around a first section of a stiffener structure (e.g., any one of the stiffeners discussed herein, such as the stiffener 102). In some embodiments, the stiffener structure comprises magnetic material. A second coil (e.g., one of coils 121, 434*a*, 434*b*, 521, or 611*c*) is wrapped around a second section of the stiffener structure. In some embodiments, the stiffener structure is disposed along at least a part of a periphery of a substrate, and wherein one or more dies are disposed on the substrate, e.g., as discussed with respect to FIGS. 1-6. In some embodiments, the stiffener structure provides mechanical rigidity or structural support to the substrate (e.g., to prevent or reduce warpage of the package), as well as act as magnetic core for one or more inductors, one or more transformers, one or more electric chokes, and/or the like.

At 708, the stiffener structure magnetically couples the first coil and the second coil, e.g., via transformer action. At 712, current is generated at the second coil, e.g., based on the current supplied through the first coil and based on the stiffener structure magnetically coupling the first coil and the second coil. At 716, the current from the second coil may be transmitted to a voltage regulator (e.g., one of the VRs 440*a*, 440*b*) that is to provide power to at least one die of the one or more dies.

Figure 7B:
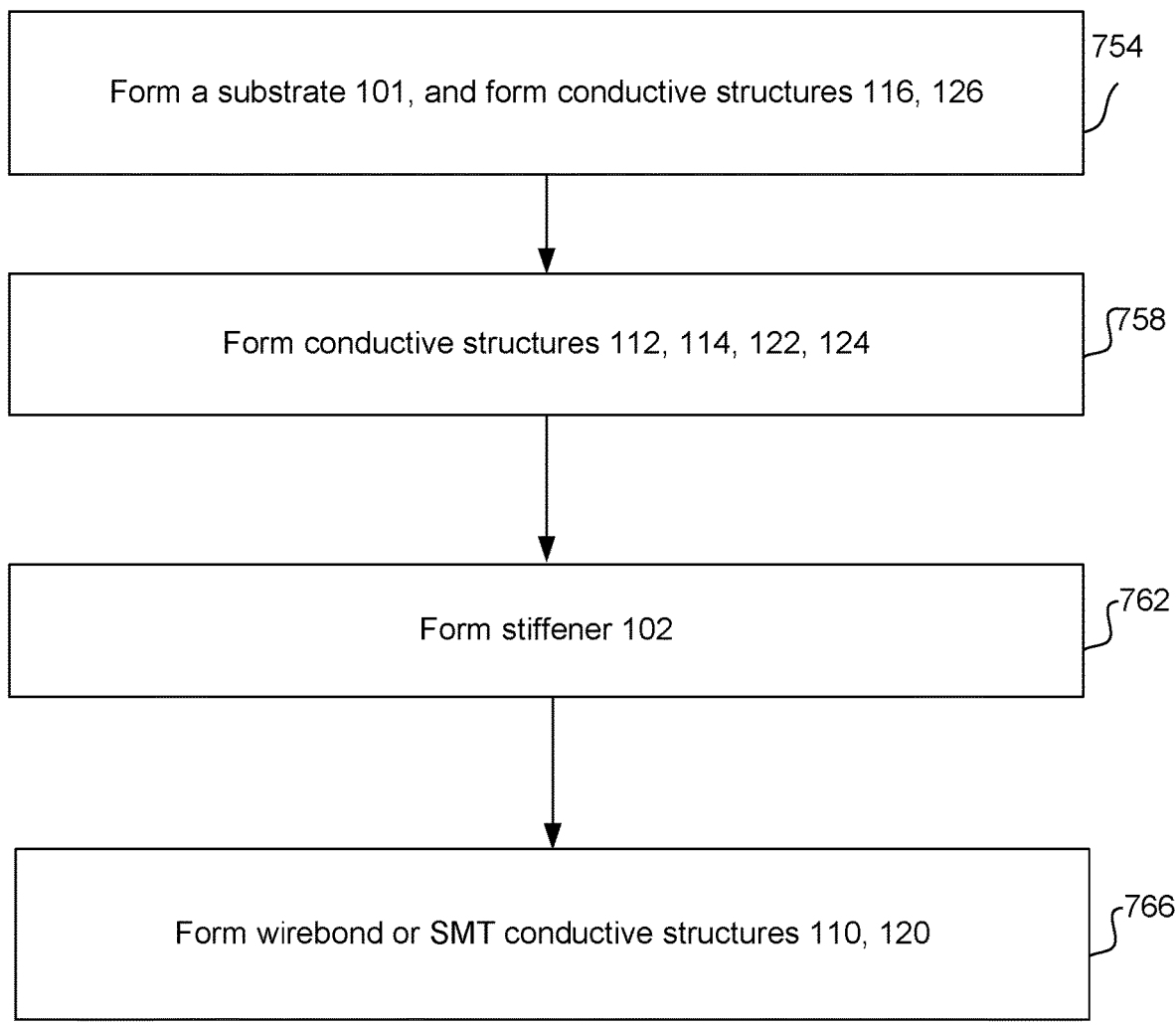
FIG. 7B is a flow diagram illustrating a method of forming a transformer using a stiffener structure, according to some embodiments.

FIG. 7B is a flow diagram illustrating a method of forming a transformer using a stiffener structure (e.g., as illustrated in FIG. 1), according to some embodiments. Although the blocks in the flowchart with reference to FIG. 7B are shown in a particular order, the order of the actions can be modified. Thus, the illustrated embodiments can be performed in a different order, and some actions/blocks may be performed in parallel. Some of the blocks and/or operations listed in FIG. 7B may be optional in accordance with certain embodiments. The numbering of the blocks presented is for the sake of clarity and is not intended to prescribe an order of operations in which the various blocks must occur.

At 754, the substrate 101 of FIG. 1 is formed, along with the conductive structures 116, 126. In an example, the conductive structures 116, 126 may be in-package routing, such as routing or traces, which are at least in part embedded within the substrate 101, or which are at least in part on the substrate 101.

At 758, conductive structures 112, 114, 122, 124 may be formed. The conductive structures 112, 114, 122, 124 may be conductive pillars (e.g., copper pillars), solder balls, pads, etc.

At 762, the stiffener 102 may be formed. The stiffener 102 may be placed on the conductive structures 116, 126, and may be placed between the conductive structures 112, 114, 122, 124.

At 766, conductive structures 110, 120 may be formed on the stiffener 102, thereby forming the coils 111, 121. The conductive structures 110, 120 may be surface mountable components, wire bonds, wires, etc. Although not illustrated in FIG. 7B, ends of the coils 111, 121 may be coupled to appropriate connection points, e.g., as discussed with respect to FIG. 4.

Figure 8:
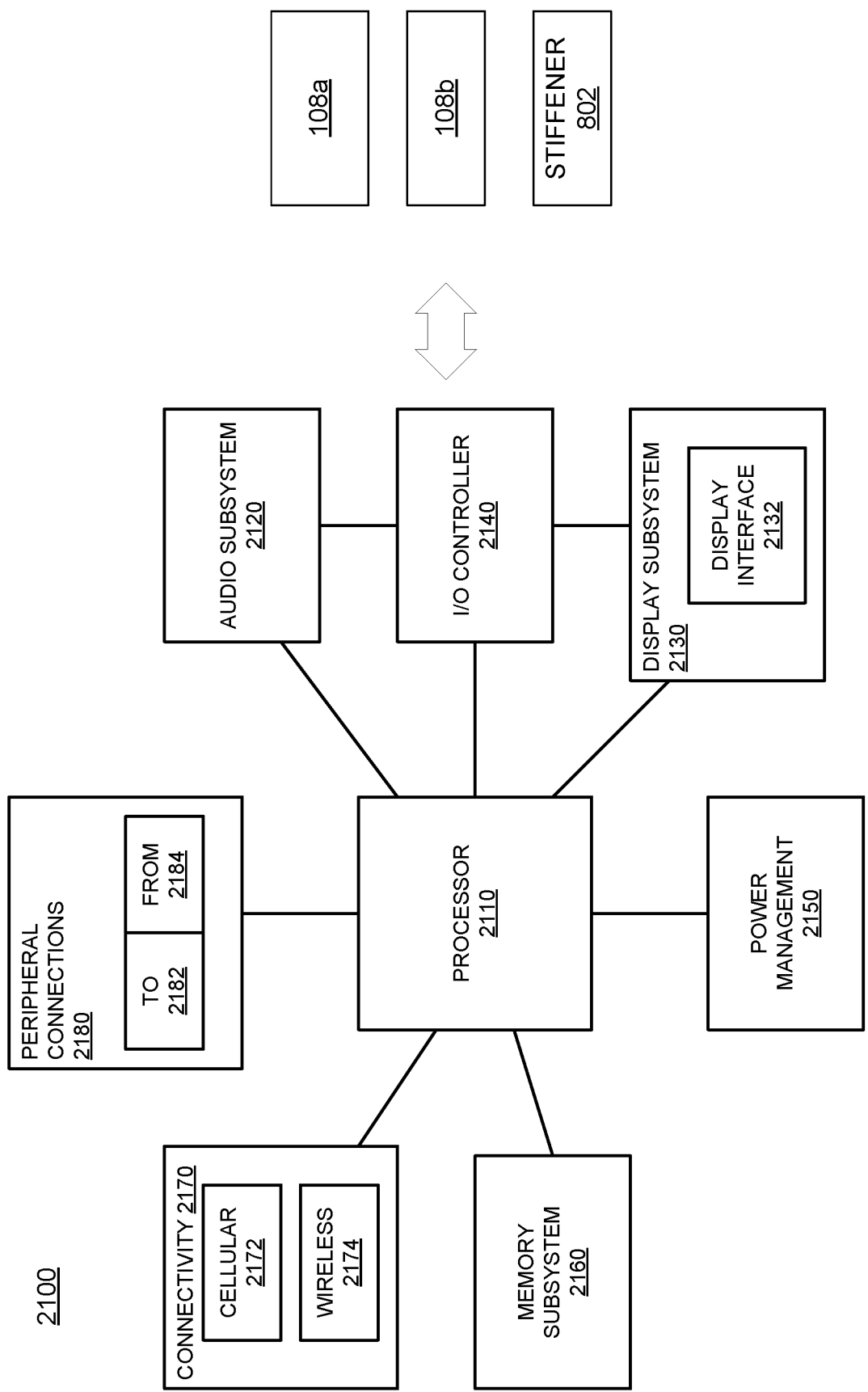
FIG. 8 illustrates a computer system, a computing device or a SoC (System-on-Chip), where a stiffener of the computing device may be reused as a magnetic core, according to some embodiments.

FIG. 8 illustrates a computer system, a computing device or a SoC (System-on-Chip) 2100, where a stiffener 802 of the computing device 2100 may be reused as a magnetic core, according to some embodiments. It is pointed out that those elements of FIG. 8 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing device 2100 are included in or be part of various structures discussed with respect to FIGS. 1-7. For example, the devices 108*a*, 108*b* of FIG. 1 may include the processor 2110, a memory of the memory subsystem 2160, and/or another appropriate component of the computing device 2100. In some embodiments, one or more components of the computing device 2100 are included in devices that are formed on a substrate, where the substrate includes the stiffener 802 that is to provide mechanical rigidity and that acts as a magnetic core. The stiffener 802 may correspond to any of the stiffeners discussed herein. The stiffener 802 may be used to form a transformer, an inductor, an electric choke, etc., as discussed in this disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a substrate; one or more integrated circuit dies on the substrate; a stiffener affixed to one or more sides of the substrate, wherein one or more sections of the stiffener comprises a magnetic material; and an inductive circuit element comprising one or more conductive structures wrapped around the magnetic material.

Example 2

The apparatus of example 1 or any other example, wherein the stiffener comprises: a plurality of intersecting segments, wherein an individual segment of the stiffener is along a corresponding side of the one or more sides of the substrate.

Example 3

The apparatus of example 1 or any other example, wherein the stiffener comprises: a first segment adjacent to a first side of the substrate; a second segment adjacent to a second side of the substrate; a third segment adjacent to a third side of the substrate; and a fourth segment adjacent to a fourth side of the substrate, wherein an individual segment of the stiffener has a length that is at least 50% of a length of a corresponding side of the substrate.

Example 4

The apparatus of example 3 or any other example, wherein: the first segment intersects with, and is substantially perpendicular to, the second and fourth segments; the second segment intersects with, and is substantially perpendicular to, the third segment; and the third segment intersects with, and is substantially perpendicular to, the fourth segment.

Example 5

The apparatus of example 3, wherein: the first, second, third, and fourth segments form an unbroken closed loop along the perimeter of the substrate, surrounding the one or more integrated circuit dies.

Example 6

The apparatus of any of examples 1-5 or any other example, wherein: the inductive circuit element is a first inductive circuit element that is wrapped around a first section of the stiffener; the stiffener includes a second section comprising the magnetic material; and the apparatus comprises a second inductive circuit element wrapped around the second section of the stiffener.

Example 7

The apparatus of example 6, wherein the stiffener includes a non-magnetic section comprising non-magnetic material interleaved between the first section and the second section.

Example 8

The apparatus of example 6 or any other example, wherein: the first inductive circuit element is a primary winding of a transformer; and the second inductive circuit element is a secondary winding of the transformer.

Example 9

The apparatus of example 6 or any other example, wherein: the stiffener includes a third section comprising magnetic material; and the apparatus comprises a third inductive circuit element wrapped around the third section of the stiffener.

Example 10

The apparatus of example 9, wherein the stiffener includes a plurality of non-magnetic section comprising non-magnetic material, wherein a first non-magnetic section is interleaved between the first section and the second section, wherein a second non-magnetic section is interleaved between the second section and the third section, and wherein a third non-magnetic section is interleaved between the first section and the third section.

Example 11

The apparatus of any of examples 1-5 or any other example, wherein the inductive circuit element comprises: a first conductive structure on a first side of the magnetic material, a second conductive structure on a second side of the magnetic material, and a third conductive structure to couple a first end of the first conductive structure to a first end of the second conductive structure.

Example 12

The apparatus of example 11 or any other example, wherein: the first conductive structure is on, or embedded within, the substrate; the magnetic material is between the first conductive structure and the second conductive structure; the second conductive structure is a wire bond or a surface mountable component coupled between the third conductive structure and a fourth conductive structure; and the individual ones of the third and fourth conductive structures comprises a conductive pillar or a solder ball.

Example 13

The apparatus of any of examples 1-5 or any other example, wherein the magnetic material includes one or more of: Nickel, Cobalt, Manganese, Molybdenum, Silicon Steel, Stainless Steel, Aluminum, Copper, Iron, plastic with magnetic particles, or magnetic ceramic material.

Example 14

The apparatus of any of examples 1-5 or any other example, wherein the magnetic material of a section of the stiffener comprises a plurality of layers of magnetic material interleaved with a corresponding plurality of insulating layers.

Example 15

The apparatus of example 1, wherein: a first section of the stiffener is separate from, and isolated from, a second section of the stiffener; the inductive circuit element is a first inductive circuit element that is wrapped around the first section of the stiffener; the second section comprises the magnetic material; and the apparatus comprises a second inductive circuit element wrapped around the second section of the stiffener.

Example 16

A system comprising: a memory to store instructions; a processor coupled to the memory, the processor to execute the instructions; a wireless interface to allow the processor to communicate with another system; a substrate; one or more dies on the substrate, wherein the one or more dies comprises one or more of the memory, processor, or the wireless interface; a stiffener affixed to one or more sides of the substrate, wherein one or more sections of the stiffener comprises a magnetic material; and an inductive circuit element comprising one or more conductive structures wrapped around the magnetic material.

Example 17

The system of example 16 or any other example, wherein the stiffener comprises: a plurality of intersecting segments, wherein an individual segment of the stiffener is along a corresponding side of the one or more sides of the substrate.

Example 18

A method comprising: supplying current through a first coil wrapped around a first section of a stiffener structure comprising magnetic material, wherein a second coil is wrapped around a second section of the stiffener structure, wherein the stiffener structure is disposed along at least a part of a periphery of a substrate, and wherein one or more dies are disposed on the substrate; magnetically coupling the first coil and the second coil via the stiffener structure; and generating current at the second coil, based on the current supplied through the first coil; and transmitting the current from the second coil to a voltage regulator that is to provide power to at least one die of the one or more dies.

Example 19

The method of example 18 or any other example, further comprising: supplying current through a third coil wrapped around a third section of the stiffener structure, wherein the current at the second coil is generated based on the current supplied through the first coil and the current through the third coil.

Example 20

The method of example 19 or any other example, wherein the first and third coils are primary coils of a Direct Current (DC) to DC forward converter, and wherein the second coil is a secondary coil of the DC to DC forward converter.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a substrate with a perimeter comprising a first side of a first length and a second side of a second length;
   one or more integrated circuit dies on the substrate;
   a stiffener affixed to the substrate, wherein the stiffener comprises:
     a first segment adjacent to the first side of the substrate and spanning at least 50% of the first length; and
     a second segment adjacent to the second side of the substrate and spanning at least 50% of the second length; and
     wherein one or more sections of the stiffener comprises a magnetic material; and
   an inductive circuit element comprising one or more conductive structures wrapped around the magnetic material, and wherein the conductive structures comprise:
     a first conductive structure under a bottom side of the magnetic material, wherein the first conductive structure is on, or embedded within, the substrate;
     a second conductive structure over a top side of the magnetic material, the magnetic material between the first conductive structure and the second conductive structure;
     a third conductive structure to couple a first end of the first conductive structure to a first end of the second conductive structure; and
     a fourth conductive structure coupled to a second end of the second conductive structure, wherein:
       the second conductive structure is a wire bond or a surface mountable component coupled between the third conductive structure and the fourth conductive structure; and
       each of the third and fourth conductive structures comprises a conductive pillar or a solder ball.

2. The apparatus of claim 1, wherein the one or more sections of the stiffener comprising the magnetic material are within one or more of the first segment or the second segment of the stiffener.

3. The apparatus of claim 1, wherein the stiffener comprises:
a third segment adjacent to a third side of the substrate; and
a fourth segment adjacent to a fourth side of the substrate, wherein each of the third and fourth segments has a length that is at least 50% of a length of a corresponding side of the substrate, and wherein the one or more sections of the stiffener comprising the magnetic material are within two or more of the first, second, third and fourth segments of the stiffener.

4. The apparatus of claim 1, wherein:
the inductive circuit element is a first inductive circuit element that is wrapped around a first section of the stiffener;
the stiffener includes a second section comprising the magnetic material; and
the apparatus comprises a second inductive circuit element wrapped around the second section of the stiffener.

5. The apparatus of claim 1, wherein the magnetic material includes one or more of: Nickel, Cobalt, Manganese, Molybdenum, Silicon Steel, Stainless Steel, Aluminum, Copper, Iron, plastic with magnetic particles, or magnetic ceramic material.

6. The apparatus of claim 1, wherein the magnetic material of a section of the stiffener comprises a plurality of layers of magnetic material interleaved with a corresponding plurality of insulating layers.

7. The apparatus of claim 1, wherein:
a first section of the stiffener is separate from, and isolated from, a second section of the stiffener;
the inductive circuit element is a first inductive circuit element that is wrapped around the first section of the stiffener;
the second section comprises the magnetic material; and
the apparatus comprises a second inductive circuit element wrapped around the second section of the stiffener.

8. A system comprising:
a memory to store instructions;
a processor coupled to the memory, the processor to execute the instructions;
a power supply to power the processor and memory; and
the apparatus of claim 1, wherein the one or more integrated circuit dies comprise the memory, and the processor.

9. A method comprising:
supplying current through a first coil wrapped around a first section of the stiffener of claim 1, wherein a second coil is wrapped around a second section of the stiffener
generating current at the second coil, based on the current supplied through the first coil; and
transmitting the current from the second coil to a voltage regulator that is to provide power to at least one die of the one or more semiconductor dies.

10. The apparatus of claim 3, wherein:
the first segment intersects with, and is substantially perpendicular to, the second and fourth segments;
the second segment intersects with, and is substantially perpendicular to, the third segment; and
the third segment intersects with, and is substantially perpendicular to, the fourth segment.

11. The apparatus of claim 3, wherein:
the first, second, third, and fourth segments form a continuous closed loop along the perimeter of the substrate, surrounding the one or more integrated circuit dies.

12. The apparatus of claim 4, wherein:
the first inductive circuit element is a primary winding of a transformer; and
the second inductive circuit element is a secondary winding of the transformer.

13. The apparatus of claim 4, wherein:
the stiffener includes a third section comprising magnetic material; and
the apparatus comprises a third inductive circuit element wrapped around the third section of the stiffener.

14. The method of claim 9, further comprising:
supplying current through a third coil wrapped around a third section of the stiffener structure,
wherein the current at the second coil is generated based on the current supplied through the first coil and the current through the third coil.

15. The method of claim 14, wherein the first and third coils are primary coils of a Direct Current (DC) to DC forward converter, and wherein the second coil is a secondary coil of the DC to DC forward converter.

16. An apparatus, comprising:
a substrate;
one or more integrated circuit dies on the substrate;
a stiffener affixed to one or more sides of the substrate, wherein one or more sections of the stiffener comprises a magnetic material, wherein the stiffener includes a non-magnetic section comprising non-magnetic material between a first section and a second section; and
an inductive circuit element comprising one or more conductive structures wrapped around the magnetic material, wherein:
the inductive circuit element is a first inductive circuit element that is wrapped around a first section of the stiffener;
the stiffener includes a second section comprising the magnetic material; and
the apparatus comprises a second inductive circuit element wrapped around the second section of the stiffener.

17. An apparatus comprising:
a substrate with a perimeter comprising a first side of a first length and a second side of a second length;
one or more integrated circuit dies on the substrate;
a stiffener affixed to the substrate, wherein the stiffener comprises:
a first segment adjacent to the first side of the substrate and spanning at least 50% of the first length; and
a second segment adjacent to the second side of the substrate and spanning at least 50% of the second length; and
wherein one or more sections of the stiffener comprises a magnetic material; and
an inductive circuit element comprising one or more conductive structures wrapped around the magnetic material, wherein:
the inductive circuit element is a first inductive circuit element that is wrapped around a first section of the stiffener;
the stiffener includes a second section comprising the magnetic material, and the apparatus comprises a second inductive circuit element wrapped around the second section of the stiffener;

the stiffener includes a third section comprising magnetic material, and the apparatus comprises a third inductive circuit element wrapped around the third section of the stiffener; and the stiffener includes a plurality of non-magnetic sections comprising non-magnetic material, wherein a first non-magnetic section is between the first section and the second section.

* * * * *